US012603616B2

(12) United States Patent
Shilimkar et al.

(10) Patent No.: US 12,603,616 B2
(45) Date of Patent: Apr. 14, 2026

(54) POWER AMPLIFIER MODULE WITH INTERLEAVED WIREBONDS

(71) Applicant: NXP USA, Inc., Austin, TX (US)

(72) Inventors: Vikas Shilimkar, Chandler, AZ (US); Joseph Agyemang Duah, Gilbert, AZ (US); Joseph Gerard Schultz, Wheaton, IL (US)

(73) Assignee: NXP USA, INC., Austin, TX (US)

( * ) Notice: Subject to any disclaimer, the term of this patent is extended or adjusted under 35 U.S.C. 154(b) by 454 days.

(21) Appl. No.: 18/377,674

(22) Filed: Oct. 6, 2023

(65) Prior Publication Data

US 2025/0119102 A1 Apr. 10, 2025

(51) Int. Cl.
| | |
|---|---|
| *H03F 1/02* | (2006.01) |
| *H03F 1/56* | (2006.01) |
| *H03F 3/24* | (2006.01) |
| *H03F 3/68* | (2006.01) |
| *H10W 44/20* | (2026.01) |

(52) U.S. Cl.
CPC .......... *H03F 1/0288* (2013.01); *H03F 1/565* (2013.01); *H03F 3/245* (2013.01); *H10W 44/20* (2026.01); *H03F 2200/451* (2013.01); *H03F 2200/541* (2013.01); *H10W 44/206* (2026.01); *H10W 44/234* (2026.01)

(58) Field of Classification Search
CPC ........ H03F 1/0288; H03F 1/565; H03F 3/245; H03F 2200/451; H03F 2200/541; H03F 2200/387; H03F 3/195; H10W 44/20; H10W 44/206; H10W 44/234
USPC ............................... 330/295, 124 R, 84, 286
See application file for complete search history.

(56) References Cited

U.S. PATENT DOCUMENTS

| | | | |
|---|---|---|---|
| 9,013,246 B2 | 4/2015 | Holmes et al. | |
| 11,114,396 B2 * | 9/2021 | Zhao | H03F 1/0288 |
| 12,525,933 B2 * | 1/2026 | Geng | H03F 3/245 |

OTHER PUBLICATIONS

U.S. Appl. No. 18/054,971, filed Nov. 14, 2022; Title: "Power Amplifier Device Having Vertical Die Interconnect Structure"; Inventors Kevin Kim et al.

* cited by examiner

*Primary Examiner* — Hieu P Nguyen

(57) ABSTRACT

A device includes a Doherty amplifier having a first amplifier die having a first output terminal, and a second amplifier die with a second output terminal. A device may include an output impedance matching network connected to an output terminal of the Doherty amplifier. A device may include an impedance inversion element connected to the second output terminal of the second amplifier die. A device may include a first wirebond array connected between the first output terminal of the first amplifier die and the output impedance matching network. A device may include a second wirebond array connected between the first output terminal of the first amplifier die and the impedance inversion element, wherein wirebonds of the first wirebond array are interleaved with wirebonds of the second wirebond array.

20 Claims, 5 Drawing Sheets

POWER AMPLIFIER MODULE WITH INTERLEAVED WIREBONDS

TECHNICAL FIELD

Embodiments of the subject matter described herein relate generally to power amplifiers and more particularly to radio frequency (RF) Doherty amplifiers and Doherty amplifier modules incorporating interleaved wirebond arrays.

BACKGROUND

Wireless communication systems employ power amplifiers for increasing the power of radio frequency (RF) signals. In a wireless communication system, a power amplifier forms a portion of the last amplification stage in a transmission chain before provision of the amplified signal to an antenna for radiation over an air interface. High gain, high linearity, stability, and a high level of power-added efficiency are characteristics of a desirable amplifier in such a wireless communication system.

In general, a power amplifier operates at maximum power efficiency when the power amplifier transmits close to saturated power. However, power efficiency tends to worsen as output power decreases. Recently, the Doherty amplifier architecture has been the focus of attention not only for base stations but also for mobile terminals because of the architecture's high power-added efficiency over a wide power dynamic range.

In power amplifiers that employ carrier and peaking amplifier arrangement, such as those in the Doherty configuration, the drain terminal of the peaking amplifier is connected via separate wirebond arrays to the amplifier's output transformer, quasi-transmission line (e.g., a phase shift and impedance inversion element connected between the peaking amplifier and the carrier amplifier), and shunt-inductor networks. Because these wirebond arrays connect to the transistor's drain terminal in different locations electrical current at different regions of the peaking amplifier's drain terminal are non-uniform. As a result, this non-uniformity can result in degraded RF performance, particularly when considering the amplifier power dispersion across frequencies.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
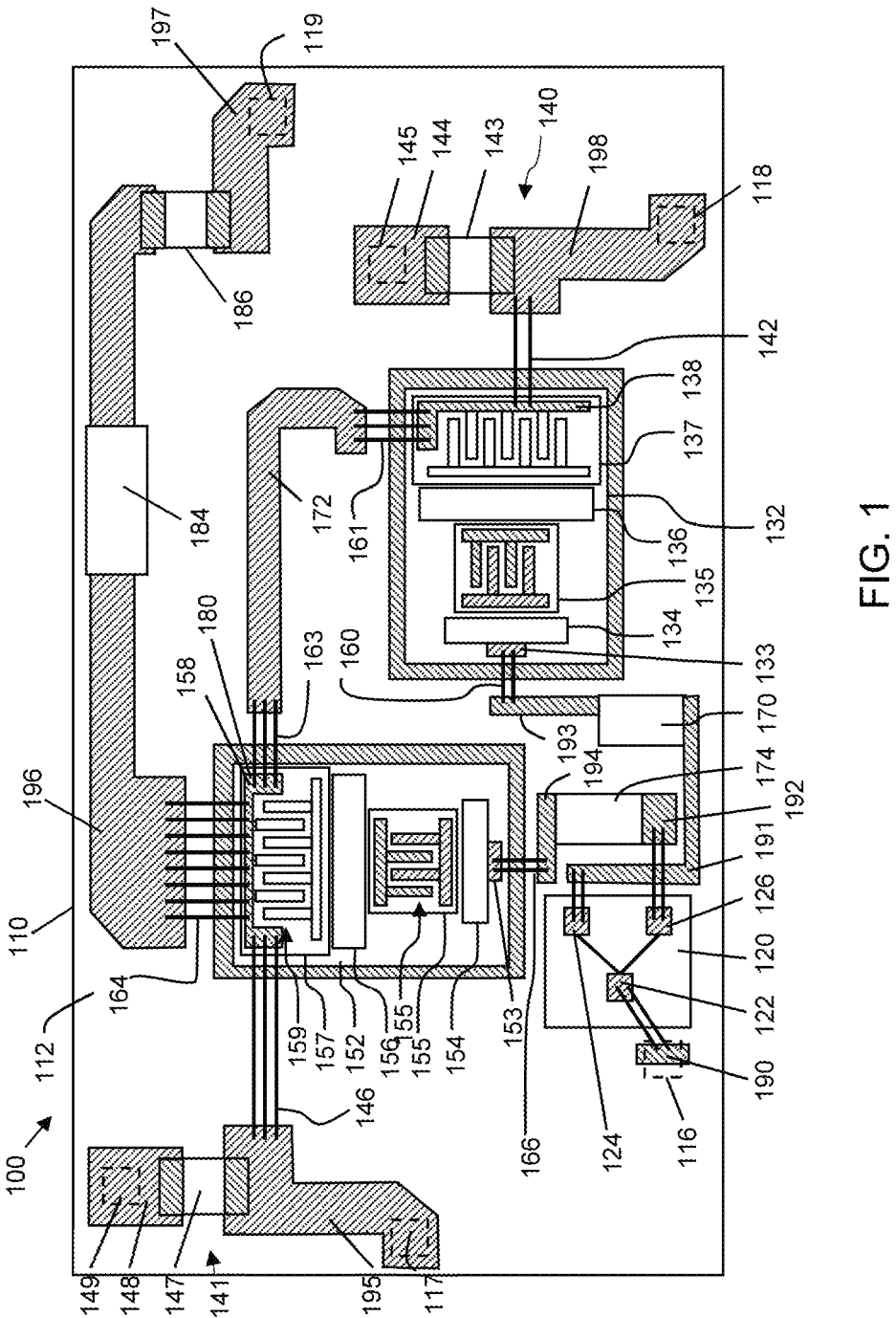
FIG. 1 is a top view of a traditional Doherty amplifier module.

In various types of amplifiers, uniform signal feed is an important consideration when designing an amplifier to provide good RF performance. In existing dual-path amplifier designs, such as those found in Doherty amplifiers, multiple, separate wirebond arrays connect the device's amplifier's output terminals to various different module components, such as the amplifier's output transformer, quasi-transmission line, and shunt-inductance networks. Because these wirebond arrays connect to different regions of the amplifiers' output terminals, current flow in those different regions is non-uniform, which can result in non-uniform signal feeds into those various amplifier components. In turn, this can result in degraded RF performance in which that non-uniform signal can generate frequency-dependent changes in amplifier output.

A typical two-way Doherty amplifier implementation includes a radio frequency (RF) signal splitter configured to divide an input RF signal into two signals, referred to as a carrier signal and a peaking signal. The amplifier includes parallel carrier and peaking amplifier paths configured to amplify the carrier and peaking signals, respectively, and a signal combiner configured to combine the amplified carrier and peaking signals. In addition, various phase shift and impedance inversion elements are disposed along the carrier and peaking amplifier paths. For example, in a traditional non-inverted Doherty amplifier architecture, a 90 degree phase shift is applied to the peaking signal prior to amplification along the peaking amplifier path, and a corresponding 90 degree phase shift and impedance inversion is applied to the carrier signal after amplification along the carrier amplifier path, and before the amplified carrier and peaking signals are combined together in phase at the amplifier's combining node.

The carrier amplifier and the peaking amplifier may each be implemented using a single-stage or multiple-stage power transistor. Using nomenclature conventionally applied to field effect transistors (FETs), the carrier amplifier transistor and the peaking amplifier transistor each may include a control terminal (e.g., a gate) configured to receive an input RF signal, and two current conducting terminals (e.g., a drain terminal and a source terminal). In some configurations, each source terminal is coupled to a ground reference node, and the amplified carrier and peaking signals are provided at the drain or output terminals of the carrier amplifier transistor and the peaking amplifier transistor, respectively. The drain terminal of the peaking amplifier may further serve as the combining node for the amplified RF signals produced by the carrier and peaking amplifiers.

To provide a 90 degree phase shift and an impedance inversion between the output terminal of the carrier amplifier and the combining node (e.g., at the drain of the peaking amplifier transistor), the drain of the carrier amplifier may be electrically coupled (e.g., with first wirebonds) to the first end of a transmission line, and the second end of the transmission line may be electrically coupled (e.g., with second wirebonds) to the drain of the peaking amplifier (e.g., the combining node). Such a configuration may be referred to as a "90/0" Doherty amplifier, because about 90 degrees of phase shift is applied to the amplified carrier output signal before it reaches the combining node, whereas no substantial phase shift is applied to the peaking output signal before it reaches the combining node.

FIG. 1 is a top view of a traditional Doherty amplifier module 100. Doherty amplifier module 100 includes a substrate 110, a power splitter 120, a carrier amplifier die 132, a peaking amplifier die 152, a phase shift and impedance inversion element 172, a first shunt impedance circuit 140 coupled to the carrier amplifier die 132, a second shunt impedance circuit 141 coupled to the peaking amplifier die 152, and various other circuit elements, which will be discussed in more detail below.

Doherty amplifier module 100 may be implemented as a land grid array (LGA) module, for example.

Substrate 110 may be a multi-layer organic substrate (e.g., formed from PCB materials) with a plurality of metal layers which are separated by dielectric material. According to an embodiment, the bottom metal layer is utilized to provide externally accessible, conductive landing pads, where the locations of some example landing pads 116-319, 145, 149 are indicated with dashed boxes in FIG. 1. These landing pads 116-119, 145, 149 (among others, not illustrated) enable surface mounting of the Doherty amplifier module 100 onto a separate substrate (not illustrated) that provides electrical connectivity to other portions of an RF system. Although module 100 is depicted as an LGA module, module 100 alternatively may be packaged as a pin grid array module, a quad flat no leads (QFN) module, or another type of package.

A patterned metal layer may be formed on the mounting surface 112 of the substrate 110. As will be discussed in more detail below, the patterned metal layer may include a plurality of conductive contacts and traces 144, 148, 190-197 on the mounting surface 112, which facilitates electrical connection to die and other components that may be mounted to the mounting surface 112. In addition, a phase shift and impedance inversion element 172 may be formed from a portion of the patterned metal layer (or from portions of one or more other conductive layers). Conductive vias provide for electrical connectivity between the metal layers.

A conductive landing pad 116 is electrically coupled through the substrate 110 to a conductive contact 190 at the mounting surface 112. The landing pad 116 and contact 190, along with the electrical connections between them, function as the RF input node for the module 100.

The power splitter 120 is coupled to the mounting surface 112. The power splitter 120 includes an input terminal 122 and two output terminals 124, 126. The input terminal 122 is electrically coupled (e.g., through wirebonds, as shown) to conductive contact 190 to receive an input RF signal. In addition, the output terminals 124, 126 are electrically coupled (e.g., through additional wirebonds, as shown) to conductive contacts 191, 192 at the mounting surface 112. The power splitter 120 is configured to split the power of the input RF signal received through input terminal 122 into first and second RF signals (e.g., carrier and peaking signals), which are produced at the output terminals 124, 126. In addition, the power splitter 120 may include a first phase shift element configured to impart about a 90 degree phase shift to the RF signal provided at output terminal 126.

The first and second RF signals may have equal or unequal power. The first RF signal produced at output terminal 124 and conveyed to conductive contact 191 is amplified through a carrier amplifier path. The carrier amplifier path includes an input circuit 170, a carrier amplifier die 132, an impedance inversion element 172 connected to the substrate 110, and a shunt inductance circuit 140 connected to the output terminal 138 of the carrier amplifier die 132. The input circuit 170 is electrically connected between conductive contacts 191 and 193.

Conductive contact 193 is electrically coupled (e.g., with wirebonds 160) to an RF input terminal 133 of the carrier amplifier die 132 to provide an RF carrier signal for amplification to the carrier amplifier die 132. The illustrated embodiment of carrier amplifier die 132 embodies a two-stage amplifier. More specifically, the electrical components of carrier amplifier die 132 include an RF input terminal 133, an input matching network 134, a driver transistor 135, an interstage matching network 136, an output transistor 137, and an RF output terminal 138. The driver and output transistors 135, 137 are coupled in series between the input and output terminals 133, 138. The driver transistor 135 is configured to apply a relatively low gain to the carrier signal, and the output transistor 137 is configured to apply a relatively high gain to the carrier signal after preliminary amplification by the driver transistor 135. In other embodiments, the carrier amplifier die 132 may embody a single stage amplifier, or may include more than two amplification stages.

The input terminal 133 of die 132 is electrically coupled to the gate terminal of transistor 135 through input matching network 134, and the drain terminal of transistor 135 is electrically coupled to the gate terminal of transistor 137 through inter-stage matching network 136. According to an embodiment, the drain terminal of transistor 137 is electrically coupled to output terminal 138. Accordingly, the signal path through the carrier amplifier die 132 is in a direction extending from the RF input terminal 133 toward the RF output terminal 138.

An amplified RF carrier signal is produced by the carrier amplifier die 132 at the RF output terminal 138. In an embodiment, the RF output terminal 138 is electrically coupled to a first end of phase shift and impedance inversion element 172, which is at least partially exposed at the mounting surface 112, with a first wirebond array 161 (i.e., a plurality of parallel, closely spaced wirebonds).

In addition, according to an embodiment, the RF output terminal 138 is electrically coupled through a first shunt inductance circuit 140 to a landing pad 145. The first shunt inductance circuit 140 includes an inductive element in the form of an array of wirebonds 142, in series with a capacitor 143 in the form of a chip capacitor. The wirebonds 142 extend from the RF output terminal 138 to conductive trace 198. Capacitor 143 has a first terminal coupled to the conductive trace 198, and a second terminal coupled to conductive pad 144. The conductive pad 144 is electrically connected through substrate 110 to landing pad 145. When integrated with a larger RF system, landing pad 145 may be connected to system ground.

According to an embodiment, the wirebonds 142 are configured to provide an inductance that enables the electrical and physical length of the phase shift and impedance inversion element 172 to be increased, in comparison with the electrical and physical length that may be used if the first shunt inductance circuit 140 were excluded from the module 100. For example, the wirebonds 142 may be configured to have an inductance value in a range of about 1 nH to about 4 nH, for example 1.5 nH, although the wirebonds 142 may be configured to have a smaller or larger inductance value, as well. Although the illustrated embodiment shows the shunt inductive element as a set of two wirebonds 142, other embodiments may include more or fewer wirebonds to achieve a desired inductance value.

As discussed previously, the shunt capacitor 143 has a capacitance value that is chosen to provide a virtual ground reference voltage for the RF electrical signals at conductive trace 198, such that wirebonds 142 function as a shunt inductance to the RF ground voltage. Desirably, the shunt capacitor 143 is series resonant in band. For example, shunt capacitor 143 may have a capacitance value of about 15 pF to about 27 pF, for example 22 pF, or more specifically in a range of about 20 pF to about 24 pF, although the capacitance value may be smaller or larger, as well.

Because trace 198 corresponds to in band RF low impedance node, in an embodiment, trace 198 may be used to provide a DC bias voltage to the output terminal 138 of transistor 137. Accordingly, in an embodiment, trace 198 also may be coupled through the substrate 110 to landing pad 118. Landing pad 118, in turn, may be coupled to a drain bias circuit in the RF system to which module 100 ultimately is connected.

According to an embodiment, the RF output terminal 138 of carrier amplifier die 132 includes an elongated first pad that is configured to enable wirebonds 161 to be connected to the first pad so that the wirebonds 161 extend in a direction that is angularly offset from (e.g., perpendicular to) the direction of the signal path through the carrier amplifier die 132. Further, the RF output terminal 138 may include an elongated second pad that is configured to enable the wirebonds 142 corresponding to the shunt inductive element of the shunt inductance circuit 140 to be connected to the second pad so that the wirebonds 142 extend in a direction that is substantially parallel to the direction of the signal path through the carrier amplifier die 132.

As mentioned above, through wirebond array 161, the RF output terminal 138 is electrically coupled to phase shift and impedance inversion element 172. According to an embodiment, phase shift and impedance inversion element 172 is implemented with a transmission line (e.g., a microstrip line) having an electrical length of about lambda/4 ($\lambda$/4) or less. The transmission line has a first end that is proximate to the carrier amplifier die 132 (and more particularly within a wirebond length of the RF output terminal 138), and a second end that is proximate to the peaking amplifier die 152 (and more particularly within a wirebond length of the RF output terminal 158 of the peaking amplifier die 152).

Moving back to the power splitter 120, the second RF signal (i.e., the peaking signal) produced at output terminal 126 of the power splitter 120 and conveyed to conductive contact 192 is amplified through a peaking amplifier path. The peaking amplifier path includes input circuit 174, a peaking amplifier die 152, and a shunt inductance circuit 141 connected to the output terminal 158 of the peaking amplifier die 152. As mentioned above, the power splitter 120 may impart about a 90 degree phase shift to the RF signal provided at output terminal 126. Accordingly, the phase of the peaking signal received at input terminal 153 of peaking die 152 is delayed by about 90 degrees with respect to the carrier signal received at input terminal 133 of carrier die 132.

The input circuit 174 is electrically connected between conductive contacts 192 and 194.

Conductive contact 194 is electrically coupled (e.g., with wirebonds 166) to an RF input terminal 153 of the peaking amplifier die 152, in order to provide an RF signal for amplification to the peaking amplifier die 152. The illustrated embodiment of peaking amplifier die 152 also embodies a two-stage amplifier. More specifically, the electrical components of peaking amplifier die 152 include an RF input terminal 153, an input matching network 154, a driver transistor 155, an interstage matching network 156, an output transistor 157, and an RF output terminal 158. The driver and output transistors 155, 157 are coupled in series between the input and output terminals 153, 158. The driver transistor 155 is configured to apply a relatively low gain to the peaking signal, and the output transistor 157 is configured to apply a relatively high gain to the peaking signal after preliminary amplification by the driver transistor 155. In other embodiments, the peaking amplifier die 152 may embody a single stage amplifier or may include more than two amplification stages. Again, each of the transistors 155, 157 may be a FET or a BJT.

As depicted in FIG. 1, transistors 155, 157 of peaking amplifier die 152 are configured as power transistors that each include a number of transistor fingers 151, 159, respectively, that each includes a plurality of individual transistors connected in parallel between input and output terminals of each transistor 155, 157. Although these parallel-connected transistors enable each transistor 155, 157 to modulate and carry higher power signals, the individual transistors constitute separate and isolated conduction paths through which current flows through transistors 155, 157. Because the transistors of transistor fingers 151, 159 carry separate signals, different regions of RF output terminal 158, which are connected to different transistors of transistor fingers 159 may have different signals, such that the signal at RF output terminal 158 is non-uniform across the width of RF output terminal 158. Similarly, different regions of RF output terminal 138, which are connected to different transistors of the transistor fingers of carrier amplifier die 132 may have different signals, such that the signal at RF output terminal 138 is non-uniform across the width of RF output terminal 138.

Figure 2:
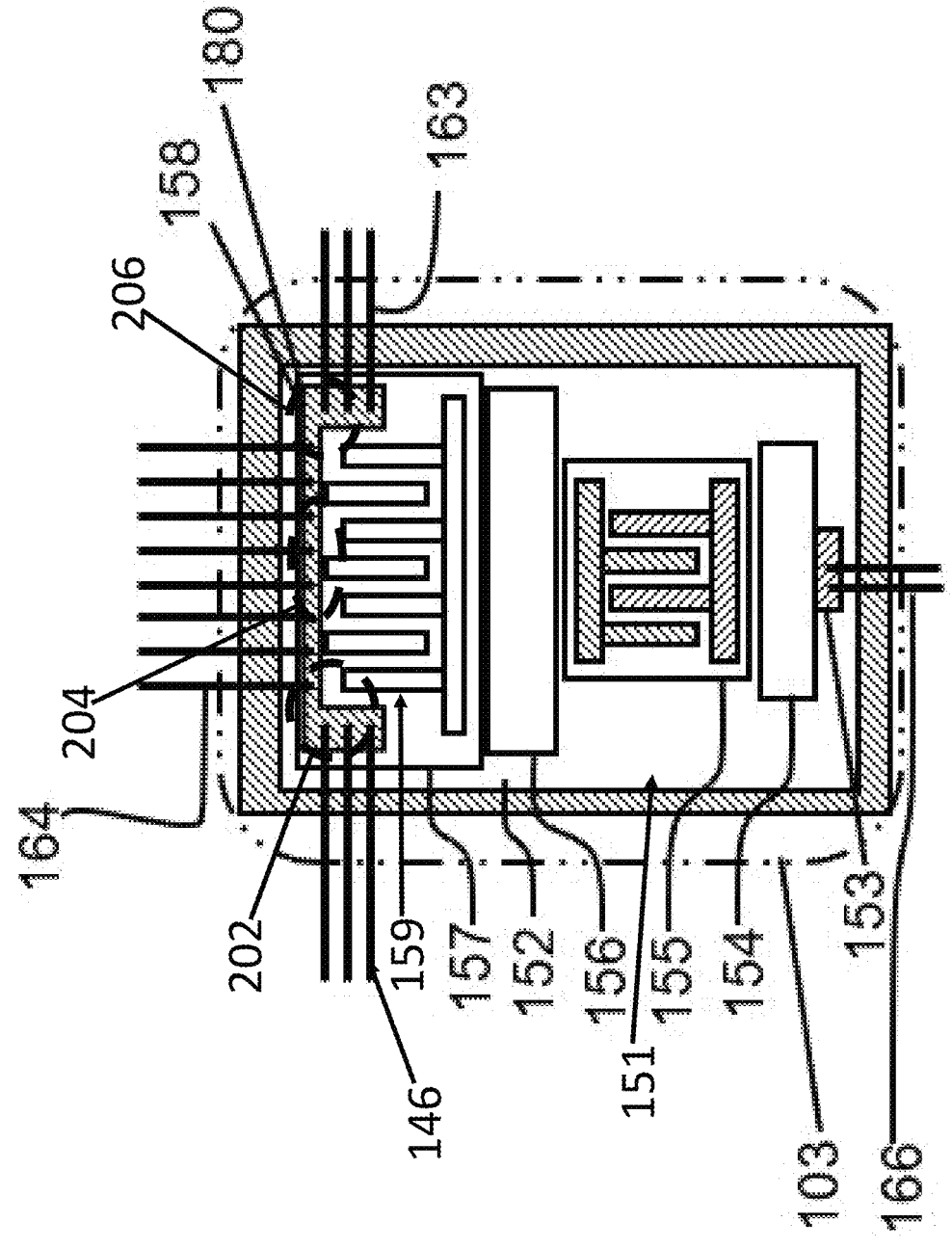
FIG. 2 depicts an enlarged portion of FIG. 1 showing a detailed view of the RF output terminal of the module's peaking amplifier die.

To illustrate this phenomenon, FIG. 2 depicts an enlarged portion of FIG. 1 showing a detailed view of RF output terminal 158 of peaking amplifier die 152. With reference to FIG. 2, region 202 of RF output terminal 158, for example, has a signal that is largely determined by the signal flowing through the transistors of transistor finger transistor fingers 159 in proximity to region 202, as well as the signal of wirebond array 146 connected to second shunt inductance circuit 141 and wirebond array 164 connected to conductive output trace 196.

Region 204 of RF output terminal 158, however, has a signal that is largely determined by the signal flowing through the transistors of transistor finger transistor fingers 159 in proximity to region 204, as well as the signal of wirebond array 164 connected to conductive output trace 196.

Region 206 of RF output terminal 158, however, has a signal that is largely determined by the signal flowing through the transistors of transistor finger transistor fingers 159 in proximity to region 204, as well as the signal of wirebond array 164 connected to conductive output trace 196 and the signal of wirebond array 163 connected to phase shift and impedance inversion element 172.

Accordingly, even though RF output terminal 158 comprises a single contiguous conductive structure, the signal passing through RF output terminal 158 may be non-uniform in different regions of RF output terminal 158. As discussed, above, this non-uniformity can result in the amplifier exhibiting inefficiencies and have reduced efficiency as compared to a similarly configured amplifier in which the signal of RF output terminal 158 is more uniform across the width of RF output terminal 158. Because carrier amplifier die 132 is similarly configured, the RF output terminal 138 of carrier amplifier die 132 will exhibit the same non-uniformity.

Returning to FIG. 1, the input terminal 153 of die 152 is electrically coupled to the gate terminal of transistor 155 through input matching network 154, and the drain terminal of transistor 155 is electrically coupled to the gate terminal of transistor 157 through inter-stage matching network 156. According to an embodiment, the drain terminal of transistor 157 is electrically coupled to output terminal 158. Accordingly, the signal path through the carrier amplifier die 152 is in a direction extending from RF input terminal 153 toward RF output terminal 158.

An amplified RF peaking signal is produced by the peaking amplifier die 152 at the RF output terminal 158. In an embodiment, and as mentioned above, the RF output terminal 158 is electrically coupled to impedance inversion element 172 with wirebond array 163, and RF output terminal 158 functions as a combining node 180 at which the amplified and delayed carrier amplifier signal is combined, in phase, with an amplified peaking amplifier signal.

In addition, according to an embodiment, the RF output terminal 158 is electrically coupled through a second shunt inductance circuit 141 to a landing pad 149. The second shunt inductance circuit 141 includes an inductive element in the form of a set of wirebonds 146, in series with a capacitor 147 in the form of a chip capacitor. The wirebonds 146 extend from the RF output terminal 158 to conductive trace 195. Capacitor 147 has a first terminal coupled to the conductive trace 195, and a second terminal coupled to conductive pad 148. The conductive pad 148 is electrically connected through the substrate 110 to landing pad 149. When integrated with a larger RF system, landing pad 149 may be connected to system ground.

According to an embodiment, the wirebonds 146 are configured to enable the electrical and physical length of the phase shift and impedance inversion element 172 to be increased, in comparison with the electrical and physical length that may be used if the first shunt inductance circuit 141 were excluded from the module 100. For example, the wirebonds 146 may be configured to have an inductance value in a range of about 1 nH to about 4 nH (e.g., 1.5 nH), although the wirebonds 146 may be configured to have a smaller or larger inductance value, as well. Although the illustrated embodiment shows the shunt inductive element as a set of two wirebonds 146, other embodiments may include more or fewer wirebonds to achieve a desired inductance value. Further, the inductance value may be controlled through variation of the loop heights of the wirebonds 146.

As discussed previously, the shunt capacitor 147 has a capacitance value that is chosen to provide a virtual ground reference voltage for the RF electrical signals at conductive trace 195, such that wirebonds 146 function as a shunt inductance to the RF ground voltage. Desirably, the shunt capacitor 147 is series resonant in band. For example, shunt capacitor 147 may have a capacitance value of about 22 pF, although the capacitance value may be smaller or larger, as well.

Because trace 195 corresponds to an in-band RF low impedance node, in an embodiment, trace 195 may be used to provide a DC bias voltage to the output terminal 158 of transistor 157. Accordingly, in an embodiment, trace 195 also may be coupled through the substrate 110 to landing pad 117. Landing pad 117, in turn, may be coupled to a drain bias circuit in the RF system to which module 100 ultimately is connected.

The signal path through the peaking amplifier die 152 is in a direction extending from the RF input terminal 153 to the RF output terminal 158. As can be seen in FIG. 1, the signal paths through the peaking and carrier amplifier die 152, 132 extend in significantly different directions, and more particularly the signal paths are perpendicular in the embodiment of FIG. 1.

According to an embodiment, except for the configurations of the RF output terminals 138, 158, the peaking amplifier die 152 may be structurally identical to the carrier amplifier die 132, meaning that the two die 132, 152 include the same structural and electrical elements arranged and interconnected in the same manner. According to a further embodiment, the peaking amplifier die 152 and the carrier amplifier die 132 can be identical in size, rendering the Doherty amplifier module 100 a symmetric Doherty amplifier. In an alternate embodiment, the peaking amplifier die 152 and the carrier amplifier die 132 may have different sizes, rendering the Doherty amplifier module 100 an asymmetric Doherty amplifier. For example, the peaking amplifier die 152 may be larger than the carrier amplifier die 132 by a ratio (e.g., 1.6:1, 2:1, or some other ratio).

Through wirebond array 163, RF output terminal 158 is electrically coupled to phase shift and impedance inversion element 172. Accordingly, the amplified carrier signal produced by the carrier amplifier die 132 is received at the RF output terminal 158 of the peaking amplifier die 152 through wirebond array 161, phase shift and impedance inversion element 172, and wirebond array 163. The amplified peaking signal produced by the peaking amplifier die 152 also is received at the RF output terminal 158, and the module 100 is configured so that the amplified carrier and peaking signals arrive and are combined at output terminal 158 (or combining node 180) in phase with each other.

According to an embodiment, the RF output terminal 158 (or combining node 180) is electrically coupled to conductive output trace 196 at the mounting surface 112 with wirebond array 164. As illustrated in FIG. 1, the wirebonds of the wirebond array 164 are aligned in the same direction as the RF signal path through the peaking amplifier die 152. In an embodiment, wirebond arrays 163, 164 are perpendicularly arranged with respect to each other at adjacent sides of die 152, wirebond arrays 146, 164 also are perpendicularly arranged with respect to each other at adjacent sides of die 152, and wirebond arrays 163, 146 are arranged in parallel with each other at opposing sides of the peaking amplifier die 152. Accordingly, even though the wirebond arrays 163, 164 and wirebond arrays 146, 164 may be positioned relatively close together, their perpendicular orientations may significantly reduce coupling of RF signals carried through the wirebond arrays 146, 163, 164.

An output impedance matching network 184 (also referred to as an output transformer) and/or a decoupling capacitor 186 may be coupled along output trace 196, in an embodiment. The output impedance matching network 184 functions to present the proper load impedance to combining node 180. Although the detail is not shown in FIG. 1, the output impedance matching network 184 may include various discrete and/or integrated components (e.g., capacitors, inductors, and/or resistors) to provide the desired impedance matching. The output impedance matching network 184 is electrically coupled through the substrate 110 to conductive landing pad 119. The landing pad 119 functions as the RF output node for the module 100.

Besides the bias circuitry connections previously discussed (e.g., including elements 117, 118, 195, 198), module 100 also may include additional bias circuitry and/or bias circuitry connections configured to provide gate and drain bias voltages to some or all of the driver and output transistors 135, 155, 137, 157. For example, the bias circuitry may include, among other things, a plurality of landing pads, contacts (at the mounting surface 112 of the substrate 110), and other conductive structures and circuitry. Bias voltages provided to the gates and/or drains of the transistors 135, 155, 137, 157 facilitate Doherty operation of the module. For example, the transistors 135, 137 of the carrier amplifier die 132 may be biased to operate in class AB mode, and the transistors 155, 157 of the peaking amplifier die 152 may be biased to operate in class C mode. The above-described configuration corresponds to a non-inverted Doherty amplifier. In an alternate embodiment, modifications could be made to configure the module 100 to function as an inverted Doherty amplifier. The inverted Doherty configuration places the −90 degree delay element on the carrier amplifier portion of the amplifier signal path and a 0 degree delay element on the peaking amplifier portion of the amplifier signal path. The carrier output 90 degree shift combines with the peaking output which has a 180 degree shift. This inverted Doherty configuration can also be referred to as 90-180 Doherty.

As depicted in FIG. 1 several wirebond arrays (e.g., wirebonds 146, wirebonds 164, and wirebonds 163) are connected to RF output terminal 158 (i.e., drain) of peaking amplifier die 152 (also referred to as the combining node 180 of module 100). Those various wirebond arrays are each separated apart from one another and, due to the multiple conductive paths through transistors 157 caused by the parallel conductive paths of each transistor of transistor fingers 159, may each carry signals that are non-uniform.

The non-uniformity in the signals of the various wirebond arrays connected to RF output terminal 158 of input matching network 154 can, during operation of module 100 reduce the amplifier's RF performance. Specifically, those non-uniformities can generate frequency-dependent changes in the amplifier peak output power. In some cases, the power dispersion across frequency, especially for higher frequencies and application can be relatively high (e.g., causing a 1.2 d dB peak power difference between 3.4 GHz and 4 GHZ) (see, for example, FIG. 4).

To remedy these problems, the present disclosure provides a novel Doherty amplifier configuration in which wirebond arrays connected to the drain terminals of the peaking and/or carrier amplifiers can be interleaved. In a specific embodiment, for example, the various wirebonds of the wirebond array that connects the drain terminal to the amplifier's output transform are interleaved or interdigitated with the wirebonds of the wirebond array that connects the drain terminal to the amplifier's quasi-line. By interleaving the wirebonds, signals from the carrier amplifier and peaking amplifier are combined uniformly at the combining node (e.g., drain terminal of the peaking die) of the amplifier across the width of the amplifier's combining node. And, specifically, a uniform signal is fed from the combining node to the output transformer from the combiner node. A similar interleaved arrangement can be utilized for connections to the amplifier's shunt-inductors for the amplifier's carrier die, as described herein.

Figure 3:
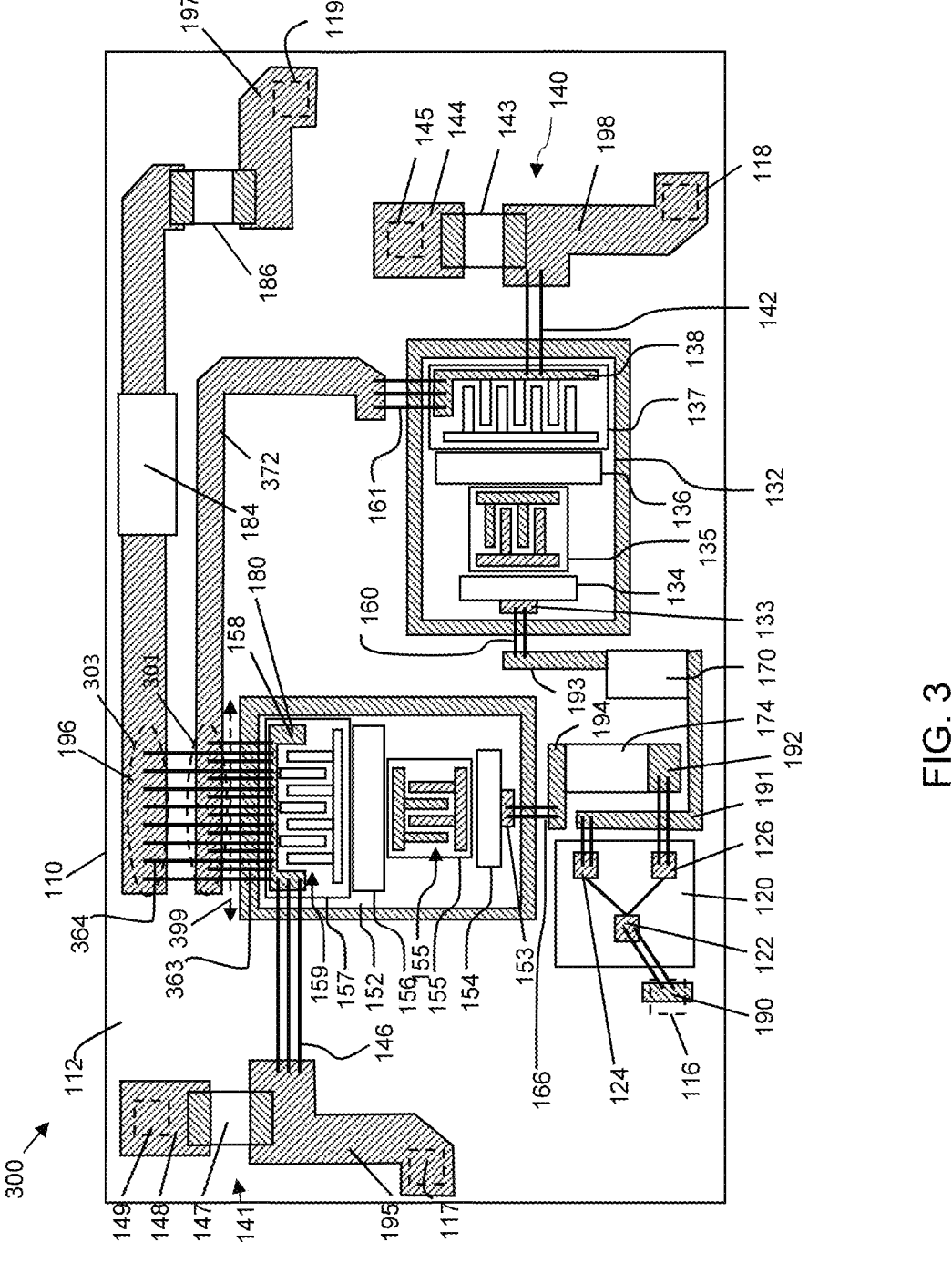
FIG. 3 depicts a Doherty amplifier module in which wirebonds connecting the RF output terminal of the module's peaking amplifier is connected to the module's output transformer and quasi line using interleaved wirebond arrays configured to evenly distribute signals carried by each set of wirebonds across the peaking amplifier's RF output terminal.

To illustrate, FIG. 3 depicts module 300 that includes a Doherty amplifier in which wirebond arrays connected to the combining node of the module are interleaved with one another to provide a more uniform signal at the amplifier's combining node. Because module 300 is configured in generally a similar manner to module 100 of FIG. 1 (i.e., they are both Doherty amplifiers), components of module 300 that are similar in configuration and operation to those of module 100 of FIG. 1 share the same element number and are as described above. Components that have a modified configuration or operation are renumbered in FIG. 3 and described in more detail herein.

Accordingly, with reference to FIG. 3, module 300 includes phase shift and impedance inversion element 372, which is connected between RF output terminal 158 of peaking amplifier die 152 and RF output terminal 138 of carrier amplifier die 132. Specifically, wirebond array 161 is connected between a first end of impedance inversion element 372 and RF output terminal 138 of carrier amplifier die 132. The opposing end of impedance inversion element 372 is routed on mounting surface 112 to be positioned between conductive output trace 196 (and, ultimately, output impedance matching network 184) and RF output terminal 158. In the embodiment depicted in FIG. 3, the second end of impedance inversion element 372 runs parallel to RF output terminal 158 for a substantial portion of the width (dimension 399 in FIG. 3) of RF output terminal 158.

In this configuration, the various wirebonds of wirebond array 363 are connected at first ends to a wirebond attach area 301 located at the second end of impedance inversion element 372 and at second ends to RF output terminal 158. Because the second end of impedance inversion element 372, which includes wirebond attach area 301, extends in parallel along the width of RF output terminal 158, this configuration enables the points at which the individual wirebonds of wirebond array 363 are connected to RF output terminal 158 to be distributed evenly along a substantial portion of the width of RF output terminal 158. In various embodiments, the arrays of wirebond array 363 and wirebond array 364 are interleaved and distributed across at least 80% of the width (dimension 399) of RF output terminal 158 to achieve desired signal distribution throughout RF output terminal 158. In other embodiments, the arrays of wirebond array 363 and wirebond array 364 are interleaved and distributed across at least 60% of the width (dimension 399) of RF output terminal 158 to achieve desired signal distribution throughout RF output terminal 158, although other configurations of wirebond array 363 and wirebond array 364 are contemplated. Consequently, the portion of the signal flowing through impedance inversion element 372 and the wirebonds of wirebond array 363 is more evenly distributed throughout RF output terminal 158, resulting in a more uniform signal in RF output terminal 158.

In a similar manner, the wirebonds of wirebond array 364, which connect conductive output trace 196 (and, specifically, the wirebond attach area 303 of conductive output trace 196) to RF output terminal 158 are connected to RF output terminal 158 at points that are similarly distributed evenly along a substantial portion of the width of RF output terminal 158. Consequently, the portion of the signal flowing through RF output terminal 158 and into conductive output trace 196 is more evenly distributed throughout RF output terminal 158, resulting in a more uniform signal in RF output terminal 158.

As illustrated in FIG. 3, one approach that enables the various wirebonds of each array of wirebonds 363 and 364 to be connected at points distributed across the width of RF output terminal 158 is to interleave or interdigitated the individual wirebonds of each wirebond array 363 and 364. To facilitate this arrangement, as depicted in FIG. 3, wirebond attach area 301 of impedance inversion element 372 is located on mounting surface 112 between wirebond attach area 303 of conductive output trace 196 and RF output terminal 158 of peaking amplifier die 152. When wirebonds 363 and 364 are interleaved, the resulting structure may include alternating wirebonds from each wirebond array 363 and 364. As depicted in FIG. 3, wirebond arrays 363 and 364 may each include the same number of wirebonds. In other embodiments, however, wirebond arrays 363 and 364 may include different numbers of wirebonds. In that case, within the resulting interleaved wirebond structure, each wirebond in the one of the arrays may be positioned within different pairs of wirebonds in the other array.

FIG. 3 depicts a Doherty amplifier module 300 in which the various wirebonds of the two wirebond arrays that connect the RF output terminal of the amplifier's peaking amplifier to both the module output transformer or output impedance matching network 184 (e.g., via conductive output trace 196) and quasi line (e.g., impedance inversion element 372) are interleaved such that they evenly distribute the signals carried by each array across the peaking amplifier's output terminal. This can result in a more uniform signal being present within the peaking amplifier's output terminal. This can, in turn, lead to a more uniform signal being fed into the output transformer of the Doherty amplifier module 300, which can result in more efficient amplifier operations in which amplifier power dispersion can be reduced across an operational frequency range of the amplifier.

Figures 4, 5, 6, 7, 8, 9:
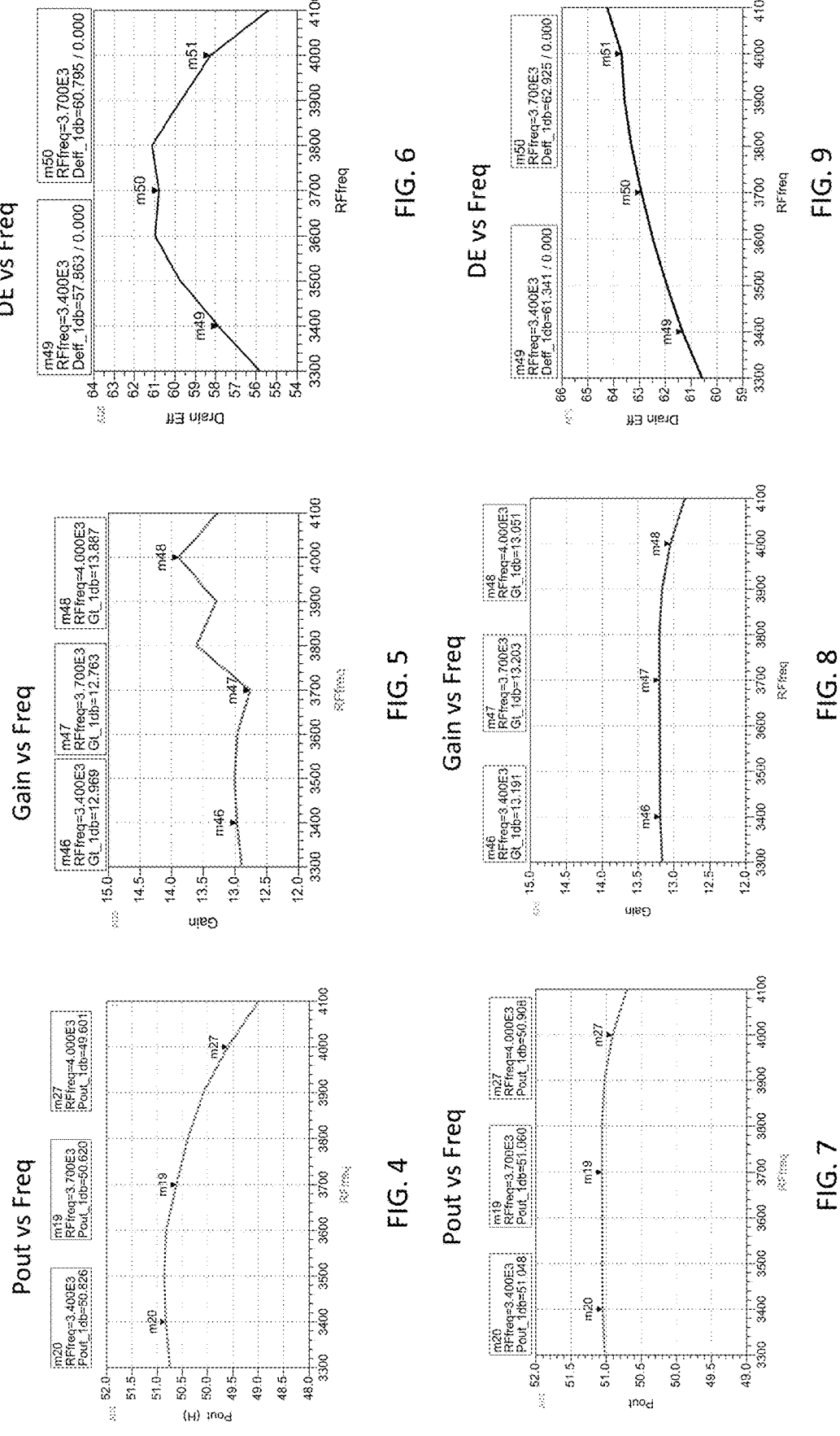
FIG. 4 is a graph depicting the relationship between an output power and frequency of a conventional Doherty amplifier.
FIG. 5 is a graph depicting the relationship between amplifier gain and frequency of a conventional Doherty amplifier.
FIG. 6 is a graph depicting the relationship between amplifier drain efficiency and frequency of a conventional Doherty amplifier configuration.
FIG. 7 is a graph depicting the relationship between an output power and frequency of a Doherty amplifier configured in accordance with the present disclosure.
FIG. 8 is a graph depicting the relationship between amplifier gain and frequency of a Doherty amplifier configured in accordance with the present disclosure.
FIG. 9 is a graph depicting the relationship between amplifier drain efficiency and frequency of a Doherty amplifier configured in accordance with the present disclosure.

To illustrate, FIG. 4 is a graph depicting the relationship between an output power (Pout) and frequency of a conventional Doherty amplifier configuration. Output power is represented by the vertical axis, while frequency is represented by the horizontal axis. As illustrated, the amplifier's power output is non-linear and changes substantially with the amplifier's operating frequency.

FIG. 5 is a graph depicting the relationship between amplifier gain and frequency of a conventional Doherty amplifier configuration. The amplifier's gain is represented by the vertical axis, while frequency is represented by the horizontal axis. As illustrated, the amplifier's gain is non-linear and changes substantially with the amplifier's operating frequency.

FIG. 6 is a graph depicting the relationship between amplifier drain efficiency (DE) and frequency of a conventional Doherty amplifier configuration. The amplifier's DE is represented by the vertical axis, while frequency is represented by the horizontal axis.

To contrast the amplifier performance attributes depicted in FIGS. 4-6 for a conventional Doherty amplifier, FIGS. 7-9 depict those same amplifier attributes for a Doherty amplifier configured in accordance with the present disclosure. Specifically, the attributes of FIGS. 7-9 are shown for an amplifier configured in accordance with the amplifier 300 configuration of FIG. 3.

Specifically, FIG. 7 is a graph depicting the relationship between an output power and frequency of a Doherty amplifier configured in accordance with the module 300 configuration of FIG. 3. Output power is represented by the vertical axis, while frequency is represented by the horizontal axis. As illustrated, the amplifier's power output as shown in FIG. 7 is significantly more linear that the same value for the conventional amplifier as shown in FIG. 4.

FIG. 8 is a graph depicting the relationship between amplifier gain and frequency of a Doherty amplifier configured in accordance with the module 300 configuration of FIG. 3. Amplifier gain is represented by the vertical axis, while frequency is represented by the horizontal axis. As illustrated, the amplifier's gain as shown in FIG. 8 is significantly more linear that the same value for the conventional amplifier as shown in FIG. 5.

FIG. 9 is a graph depicting the relationship between amplifier DE and frequency of a Doherty amplifier configured in accordance with the module 300 configuration of FIG. 3. Amplifier DE is represented by the vertical axis, while frequency is represented by the horizontal axis. As illustrated, the amplifier's DE as shown in FIG. 9 demonstrates a significantly higher DE than the same value for the conventional amplifier as shown in FIG. 6.

Returning to FIG. 3, module 300 includes a Doherty amplifier configuration in which the amplifier's quasi-line is configured to run between the RF output terminal of the amplifier's peaking amplifier and the amplifier's output transformer or impedance matching network. As discussed above, this enable the wirebonds that couple the RF output terminal to each of the quasi-line and the output transform to be connected at points distributed across the width of the RF output terminal (e.g., via interleaving both sets of wirebonds) to provide a more uniform signal flow through the RF output terminal.

In an alternative configuration, it is contemplated that other wirebond arrays with the Doherty amplifier could be interleaved in a similar fashion to further provide uniform signal flow through the amplifier's various signal paths.

Figure 10:
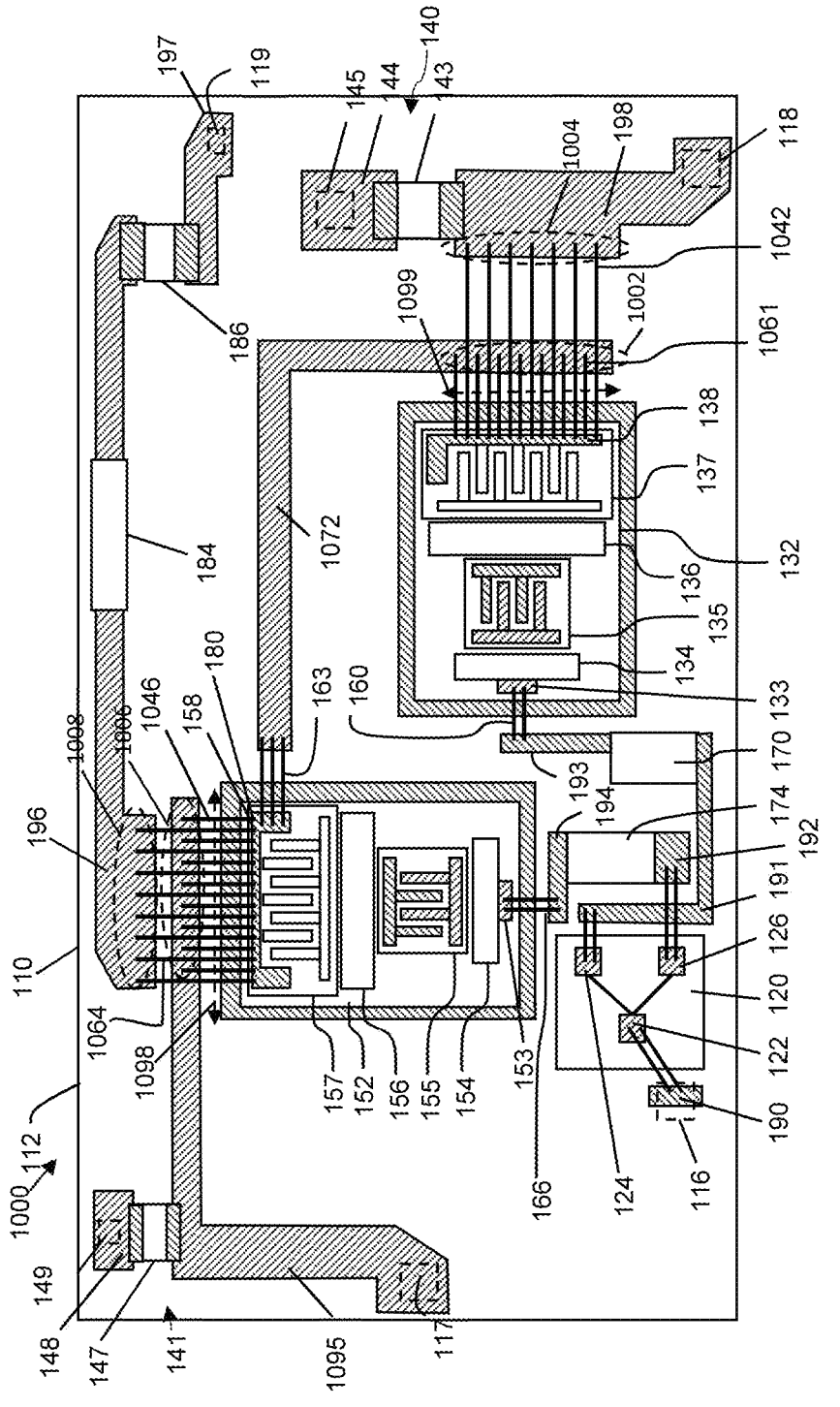
FIG. 10 depicts a module that includes the Doherty amplifier arrangement of FIG. 1 in which wirebond arrays connected to the combining node of the module are interleaved with one another to provide a more uniform signal at the amplifier's combining node.

FIG. 10 depicts module 1000 that includes a Doherty amplifier in which wirebond arrays connected to the combining node of the module are interleaved with one another to provide a more uniform signal at the amplifier's combining node. Additionally, wirebond arrays connected to the RF output terminal 138 of carrier amplifier die 132 are similarly interleaved to provide a more uniform signal at the output terminal of the carrier amplifier. Because module 1000 is generally configured in a similar manner to module 100 of FIG. 1, components of module 1000 that are similar in configuration and operation to those of module 100 of FIG. 1 share the same element number and are as described above. Components that have a modified configuration or operation are renumbered in FIG. 10 and described in more detail herein.

Accordingly, with reference to FIG. 10, module 1000 includes phase shift and impedance inversion element 1072, which is connected between RF output terminal 158 of peaking amplifier die 152 and RF output terminal 138 of carrier amplifier die 132.

The first end of impedance inversion element 1072 is routed on mounting surface 112 to be positioned between conductive trace 198, which is connected to first shunt inductance circuit 140 and RF output terminal 158. In the embodiment depicted in FIG. 10, the first end of impedance inversion element 1072 runs parallel to RF output terminal 138 for a substantial portion of the width (dimension 1099 in FIG. 10) of RF output terminal 138.

In this configuration, wirebond array 1061 connects the first end of impedance inversion element 1072 to RF output terminal 138 of carrier amplifier die 132. And, specifically, the wirebonds of wirebond array 1061 are connected to impedance inversion element 1072 within the wirebond attach area 1002 of impedance inversion element 1072. Because the first end of impedance inversion element 1072 including wirebond attach area 1002 extends in parallel along the width of RF output terminal 138 (indicated by dimension 1099), this configuration enables the points at which the individual wirebonds of wirebond array 1061 are connected to RF output terminal 138 to be distributed evenly along a substantial portion of the width of RF output terminal 138. In various embodiments, the arrays of wirebond array 1061 and wirebond array 1042 are interleaved and distributed across at least 80% of the width (dimension 1099) of RF output terminal 138 to achieve desired signal distribution throughout RF output terminal 138. In other embodiments, the arrays of wirebond array 1061 and wirebond array 1042 are interleaved and distributed across at least 60% of the width (dimension 1099) of RF output terminal 138 to achieve desired signal distribution throughout RF output terminal 138, although other configurations of wirebond array 1061 and wirebond array 1042 are contemplated. Consequently, the signal flowing out of RF output terminal 138 and into wirebond array 1061 and 1042 is more evenly distributed throughout RF output terminal 138, resulting in a more uniform signal in RF output terminal 138 that is fed into impedance inversion element 1072.

In a similar manner, the wirebonds of wirebond array 1042, which connect conductive trace 198 to RF output terminal 138, are connected to RF output terminal 138 at points that are distributed evenly along a substantial portion of the width of RF output terminal 138 of carrier amplifier die 132. Consequently, the portion of the signal flowing through RF output terminal 138 and wirebond array 1042 into conductive trace 198 and, ultimately, first shunt inductance circuit 140 is more evenly distributed throughout RF output terminal 138, resulting in a more uniform signal in RF output terminal 138.

As illustrated in FIG. 10, one approach that enables the various wirebonds of each wirebond array 1061, and 1042 to be connected at points distributed across the width of RF output terminal 138 is to interleave or interdigitated the individual wirebonds of wirebond arrays 1061 and 1042. To facilitate this arrangement, as depicted in FIG. 10, wirebond attach area 1002 of impedance inversion element 1072 is located on mounting surface 112 between wirebond attach area 1004 of conductive output trace 196 and RF output terminal 138 of carrier amplifier die 132. When wirebond arrays 1061 and 1042 are interleaved, the resulting structure may include alternating wirebonds from each wirebond array 1061 and 1042. As depicted in FIG. 10, wirebond arrays 1061 and 1042 may each include the same number of wirebonds. In other embodiments, however, wirebond arrays 1061 and 1042 may include different numbers of wirebonds. In that case, within the resulting interleaved wirebond structure, each wirebond in the one of the arrays may be positioned within different pairs of wirebonds in the other array.

A similar arrangement is utilized in conjunction with peaking amplifier die 152. Specifically, as shown in FIG. 10, conductive trace 1095, which is connected to second shunt inductance circuit 141, is routed on mounting surface 112 to be positioned between conductive output trace 196 and RF output terminal 158 of peaking amplifier die 152. In the embodiment depicted in FIG. 10, a portion of conductive trace 1095 runs parallel to RF output terminal 158 for a substantial portion of the width (dimension 1098 in FIG. 10) of RF output terminal 158. That portion of conductive trace

1095 includes wirebond attach area 1006 which includes the region of conductive trace 195 to which wirebonds of wirebond array 1046 are attached.

In this configuration, wirebond array 1046 are connected between wirebond attach area 1006 of conductive trace and RF output terminal 158 of peaking amplifier die 152. Because the wirebond attach area 1006 of conductive trace 1095 extends in parallel along the width of RF output terminal 158, this configuration enables the points at which the individual wirebonds of wirebond array 1046 are connected to RF output terminal 158 to be distributed evenly along a substantial portion of the width of RF output terminal 158. In various embodiments, the arrays of wirebond array 1046 and wirebond array 1064 are interleaved and distributed across at least 80% of the width (dimension 1098) of RF output terminal 158 to achieve desired signal distribution throughout RF output terminal 158. In other embodiments, the arrays of wirebond array 1046 and wirebond array 1064 are interleaved and distributed across at least 60% of the width (dimension 1098) of RF output terminal 158 to achieve desired signal distribution throughout RF output terminal 158, although other configurations of wirebond array 1046 and wirebond array 1064 are contemplated. Consequently, the signal flowing out of RF output terminal 158 and into wirebond array 1046 and, ultimately, into second shunt inductance circuit 141 is more evenly distributed throughout RF output terminal 158, resulting in a more uniform signal in RF output terminal 158 that is fed into second shunt inductance circuit 141.

In a similar manner, the wirebonds of wirebond array 1064, which are connected between the wirebond attach area 1008 of conductive output trace 196 and RF output terminal 158 are similarly connected to RF output terminal 158 at points that are distributed evenly along a substantial portion of the width of RF output terminal 158 of peaking amplifier die 152. Consequently, the portion of the signal flowing through RF output terminal 158 and wirebond array 1046 into conductive output trace 196 is more evenly distributed throughout RF output terminal 158, resulting in a more uniform signal in RF output terminal 158.

As illustrated in FIG. 10, one approach that enables the various wirebonds of each wirebond array 1046 and 1064 to be connected at points distributed across the width of RF output terminal 158 is to interleave or interdigitated the individual wirebonds of wirebond arrays 1046 and 1064. To facilitate this arrangement, as depicted in FIG. 10, wirebond attach area 1006 of conductive trace 1095 is located on mounting surface 112 between wirebond attach area 1008 of conductive output trace 196 and RF output terminal 158 of peaking amplifier die 152. When wirebond arrays 1046 and 1064 are interleaved, the resulting structure may include alternating wirebonds from each wirebond array 1046 and 1064. As depicted in FIG. 10, wirebond arrays 1046 and 1064 may each include the same number of wirebonds. In other embodiments, however, wirebond arrays 1046 and 1064 may include different numbers of wirebonds. In that case, within the resulting interleaved wirebond structure, each wirebond in the one of the arrays may be positioned within different pairs of wirebonds in the other array.

In various embodiments of the present disclosure, the solutions illustrated in FIG. 3 and FIG. 10 can be used in different combinations. For example, an amplifier module can be configured so that the wirebond arrangement depicted in FIG. 3 (in which wirebond arrays 363 and 364 that connect to impedance inversion element 372 and conductive output trace 196, respectively, are interleaved) may be used in conjunction with the amplifier's peaking amplifier die 152, while the wirebond configuration depicted in FIG. 10 (in which wirebond arrays 1061 and 1042 that connect to impedance inversion element 1072 and conductive trace 198, respectively, are interleaved) may be used in conjunction with the amplifier's carrier amplifier die 132.

It is further contemplated in the present invention, that, the peaking amplifier die configurations depicted in FIGS. 3 and 10 could be combined such that the wirebond attach area 301 of impedance inversion element 372 (FIG. 3) as well as the wirebond attach area 1006 of conductive trace 1095 (FIG. 10) could both be disposed between the RF output terminal 158 of peaking amplifier die 152 and the wirebond attach area of conductive output trace 196 (illustrated as wirebond attach area 303 in FIG. 3 and wirebond attach area 1008 in FIG. 10). In that case, the three sets of corresponding wirebond arrays (e.g., the wirebond arrays connecting each of the amplifier's output trace (e.g., conductive output trace 196 of FIGS. 3 and 10), shunt-L network conductive trace (e.g., conductive trace 1095 of FIG. 10), and quasi-line (e.g., impedance inversion element 372 of FIG. 3)) could be interleaved.

The above-described embodiments can include two-way Doherty power amplifier implementations, which include a carrier amplifier and one peaking amplifier. According to other embodiments, the amplifier of the present disclosure may include more than one peaking amplifier or may be modified to implement types of amplifiers other than Doherty amplifiers. Said another way, modules configured to incorporate the various interleaved wirebond array configurations contemplated by the present disclosure thus may be utilized in amplifier configurations other than those illustrated and discussed herein.

Various modifications may be made to modules 300 and/or 1000 without departing from the scope of the inventive subject matter. For example, each of the carrier and peaking amplifier die 132, 152 may include single stage amplifiers, or two distinct amplifier die (one driver amplifier die and one output amplifier die).

In some aspects, the techniques described herein relate to a Doherty amplifier, including: a first amplifier die including a first power transistor and having a first output terminal at which a first amplified signal is generated; a second amplifier die including a second power transistor with a second output terminal at which a second amplified signal is generated; an output impedance matching network connected to an output terminal of the Doherty amplifier; an impedance inversion element connected to the second output terminal of the second amplifier die; a first wirebond array connected between the first output terminal of the first amplifier die and the output impedance matching network; and a second wirebond array connected between the first output terminal of the first amplifier die and the impedance inversion element, wherein wirebonds of the first wirebond array are interleaved with wirebonds of the second wirebond array.

In some aspects, the techniques described herein relate to a Doherty amplifier, including: a first amplifier die including a first power transistor and having a first output terminal at which a first amplified signal is generated; a second amplifier die including a second power transistor with a second output terminal at which a second amplified signal is generated; an output transformer connected to an output terminal of the Doherty amplifier; a shunt inductance network; an impedance inversion element; a first wirebond array connected between the first output terminal of the first amplifier die and the output transformer; a second wirebond array connected between the second output terminal of the second amplifier die and the impedance inversion element; and a third wirebond array connected between the second output terminal of the second amplifier die the shunt inductance network, wherein wirebonds of the second wirebond array are interleaved with wirebonds of the third wirebond array.

In some aspects, the techniques described herein relate to an amplifier, including: a substrate; a first amplifier die on the substrate, the first amplifier die including a first power transistor and having a first output terminal at which a first amplified signal is generated; a second amplifier die on the substrate, the second amplifier die including a second power transistor with a second output terminal at which a second amplified signal is generated; a first electrical component on the substrate, the first electrical component including a first wirebond attach area; a second electrical component on the substrate, the second electrical component including a second wirebond attach area; a first wirebond array connected between the first output terminal of the first amplifier die and the first wirebond attach area; and a second wirebond array connected between the first output terminal of the first amplifier die and the second wirebond attach area, wherein wirebonds of the first wirebond array are interleaved with wirebonds of the second wirebond array.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A Doherty amplifier, comprising:
a first amplifier die including a first power transistor and having a first output terminal at which a first amplified signal is generated;
a second amplifier die including a second power transistor with a second output terminal at which a second amplified signal is generated;
an output impedance matching network connected to an output terminal of the Doherty amplifier;
an impedance inversion element connected to the second output terminal of the second amplifier die;
a first wirebond array connected between the first output terminal of the first amplifier die and the output impedance matching network; and
a second wirebond array connected between the first output terminal of the first amplifier die and the impedance inversion element, wherein wirebonds of the first wirebond array are interleaved with wirebonds of the second wirebond array.

2. The Doherty amplifier of claim 1, wherein the output impedance matching network includes a conductive output trace and wirebonds of the first wirebond array are attached to the conductive output trace.

3. The Doherty amplifier of claim 2, wherein the conductive output trace includes a first wirebond attach area, the impedance inversion element includes a second wirebond attach area, the wirebonds of the first wirebond array are connected directly to conductive output trace in the first wirebond attach area, the wirebonds of the second wirebond array are connected directly to the impedance inversion element in the second wirebond attach area, and the second wirebond attach area is between the first output terminal of the first amplifier die and the first wirebond attach area of the conductive output trace.

4. The Doherty amplifier of claim 1, wherein the wirebonds of the first wirebond array are interleaved with wirebonds of the second wirebond array so that a first wirebond of the first wirebond array is between a first wirebond of the second wirebond array and a second wirebond of the second wirebond array.

5. The Doherty amplifier of claim 4, wherein at least one of:
each wirebond in the first wirebond array is between first and second wirebonds of the second wirebond array; or
each wirebond in the second wirebond array is between first and second wirebonds of the first wirebond array.

6. The Doherty amplifier of claim 1, wherein the wirebonds of the first wirebond array have an electrical length resulting in a 90 degree phase shift imparted to a signal between the second output terminal of the second amplifier die and the first output terminal of the first amplifier die.

7. The Doherty amplifier of claim 1, wherein the first amplifier die and the second amplifier die comprise a peaking amplifier die and a carrier amplifier die of the Doherty amplifier, respectively.

8. A Doherty amplifier, comprising:
a first amplifier die including a first power transistor and having a first output terminal at which a first amplified signal is generated;
a second amplifier die including a second power transistor with a second output terminal at which a second amplified signal is generated;
an output transformer connected to an output terminal of the Doherty amplifier;
a shunt inductance network;
an impedance inversion element;
a first wirebond array connected between the first output terminal of the first amplifier die and the output transformer;
a second wirebond array connected between the second output terminal of the second amplifier die and the impedance inversion element; and
a third wirebond array connected between the second output terminal of the second amplifier die the shunt inductance network, wherein wirebonds of the second wirebond array are interleaved with wirebonds of the third wirebond array.

9. The Doherty amplifier of claim 8, wherein the impedance inversion element includes a first wirebond attach area, the shunt inductance network includes a first conductive trace having a second wirebond attach area, wirebonds of the second wirebond array are connected directly to impedance inversion element in the first wirebond attach area, wirebonds of the third wirebond array are connected directly to the second wirebond attach area of the first conductive trace, and the first wirebond attach area is between the second output terminal of the second amplifier die and the second wirebond attach area.

10. The Doherty amplifier of claim 8, wherein the wirebonds of the second wirebond array are interleaved with wirebonds of the third wirebond array so that a first wirebond of the second wirebond array is between a first wirebond of the third wirebond array and a second wirebond of the third wirebond array.

11. The Doherty amplifier of claim 10, wherein at least one of:
each wirebond in the second wirebond array is between pairs of wirebonds of the third wirebond array; or
each wirebond in the third wirebond array is between pairs of wirebonds of the second wirebond array.

12. The Doherty amplifier of claim 8, wherein the first amplifier die and the second amplifier die comprise a peaking amplifier die and a carrier amplifier die of the Doherty amplifier, respectively.

13. An amplifier, comprising:
a substrate;
a first amplifier die on the substrate, the first amplifier die including a first power transistor and having a first output terminal at which a first amplified signal is generated;
a second amplifier die on the substrate, the second amplifier die including a second power transistor with a second output terminal at which a second amplified signal is generated;
a first electrical component on the substrate, the first electrical component including a first wirebond attach area;
a second electrical component on the substrate, the second electrical component including a second wirebond attach area;

a first wirebond array connected between the first output terminal of the first amplifier die and the first wirebond attach area; and a second wirebond array connected between the first output terminal of the first amplifier die and the second wirebond attach area, wherein wirebonds of the first wirebond array are interleaved with wirebonds of the second wirebond array.

14. The amplifier of claim 13, wherein the wirebonds of the first wirebond array are interleaved with wirebonds of the second wirebond array so that a first wirebond of the first wirebond array is between a first wirebond of the second wirebond array and a second wirebond of the second wirebond array.

15. The amplifier of claim 14, wherein at least one of:

each wirebond in the first wirebond array is between wirebonds of the second wirebond array; or each wirebond in the second wirebond array is between wirebonds of the first wirebond array.

16. The amplifier of claim 13, wherein the first electrical component includes an output transformer connected to an output terminal of the amplifier.

17. The amplifier of claim 13, where the first electrical component includes a shunt inductance.

18. The amplifier of claim 17, wherein the second electrical component includes an impedance inversion element.

19. The amplifier of claim 18, wherein the impedance inversion element includes the second wirebond attach area and the second wirebond attach area is between first output terminal of the first amplifier die and the first wirebond attach area.

20. The amplifier of claim 13, wherein the first amplifier die and the second amplifier die comprise a peaking amplifier die and a carrier amplifier die of a Doherty amplifier, respectively.

* * * * *